(12) United States Patent
Lin

(10) Patent No.: US 7,099,643 B2
(45) Date of Patent: Aug. 29, 2006

(54) ANALOG OPEN-LOOP VCO CALIBRATION METHOD

(75) Inventor: Tsung-Hsien Lin, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 378 days.

(21) Appl. No.: 10/445,536

(22) Filed: May 27, 2003

(65) Prior Publication Data
US 2004/0242175 A1    Dec. 2, 2004

(51) Int. Cl.
*H04B 1/16* (2006.01)
*H04B 7/20* (2006.01)

(52) U.S. Cl. ............... 455/255; 455/147; 455/208; 455/265

(58) Field of Classification Search ............... 455/63.1, 455/76, 147, 208, 180.3, 184.1, 191.2, 189.4, 455/195.1, 196.1, 199.1, 255–265
See application file for complete search history.

(56) References Cited

U.S. PATENT DOCUMENTS

| | | | |
|---|---|---|---|
| 6,249,685 B1* | 6/2001 | Sharaf et al. ............... 455/84 |
| 6,308,049 B1* | 10/2001 | Bellaouar et al. ............. 455/76 |
| 6,622,010 B1* | 9/2003 | Ichimaru ..................... 455/76 |
| 6,707,342 B1* | 3/2004 | Zachan et al. ................. 331/2 |
| 2002/0044025 A1* | 4/2002 | Park ............................ 332/123 |
| 2003/0224747 A1* | 12/2003 | Anand ........................ 455/208 |
| 2003/0224749 A1* | 12/2003 | Uozumi et al. ........... 455/252.1 |

* cited by examiner

*Primary Examiner*—Simon Nguyen
(74) *Attorney, Agent, or Firm*—Garlick Harrison & Markison; James A. Harrison

(57) ABSTRACT

An analog open-loop voltage controlled oscillator (VCO) calibration circuit and method for selecting the frequency of the VCO for a phase locked loop (PLL).

A frequency divider module produces a 50% duty cycle divided local oscillation and a 50% duty cycle divided reference signal, wherein the divided signals are substantially equal. A period-to-voltage conversion module converts the divided local oscillation signal and the divided reference signal to voltages proportional to the divided signals. A comparator module produces a frequency adjustment signal based on a comparison of the proportional voltages and couples the frequency adjustment signal to a logic module which produces a frequency compensation signal based on the frequency adjustment signal. The frequency compensation signal functions to adjust the configuration of switched capacitors in a capacitor bank, coupled to the VCO tuned circuit, until the divided local oscillation signal is substantially equal to the divided reference signal.

38 Claims, 13 Drawing Sheets open-loop VCO calibration circuit block diagram open-loop VCO calibration circuit block diagram open-loop VCO calibration of a local oscillator calibration circuit block diagram calibration circuit block diagram alternate calibration circuit embodiment period-to-voltage converter

ANALOG OPEN-LOOP VCO CALIBRATION METHOD

BACKGROUND OF THE INVENTION

1. Technical Field of Invention

The present invention relates to wireless communications and, more particularly, wideband wireless communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.). As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals. A filtering stage filters the low IF signals to attenuate unwanted out-of-band signals to produce a filtered signal. The data recovery stage recovers raw data from the filtered signal in accordance with the particular wireless communication standard.

One problem of using local oscillations to up-convert baseband signals to RF signals and to down-convert RF signals to baseband signals, however, is maintaining the correct local oscillation frequencies. An inaccurate local oscillation, when coupled to the mixer, will cause the mixed product to be inaccurate as well. There is a need, therefore, for a wireless transceiver system that allows for full integration on-chip of circuit designs that provide a method and a circuit to calibrate local oscillations.

Additionally, because many wireless transceivers often operate on batteries or stored energy, designs are continuously being pursued which reduce power consumption and place a circuit into a standby, sleep, or idle mode to reduce power consumption. As communication devices increase in speed, however, the amount of time for a device to transition from an idle or standby mode to a fully operational mode is reduced. For example, many transceivers power down to an idle state until they receive a paging signal indicating an incoming communication. For today's fast transmission rates, the time to transition to a particular communications channel is small. There is a need also, therefore, for a local oscillation calibration circuit that rapidly completes the calibration process.

BRIEF SUMMARY OF THE INVENTION

An analog open-loop voltage controlled oscillator (VCO) calibration circuit and method for selecting the frequency of the VCO for a phase locked loop (PLL) provides faster calibration than prior art circuits because the analog open-loop calibration loop converges to a calibrated state within a few cycles. Analog period-to-voltage converters produce voltages that are proportional to a reference signal and a divided local oscillation signal thus allowing rapid corrections to the calibration loop. Additionally, a low VCO gain is achieved through the use of a plurality of switched capacitors coupled to a tuned circuit within the VCO. The calibration circuit comprises a frequency divider module, a period-to-voltage converter, a comparator module that compares the voltage levels that represent signal periods, and a logic module.

The frequency divider module, comprising a plurality of frequency dividers, is coupled to receive a local oscillation signal from the VCO and a reference signal from the PLL, and produces a divided local oscillation and a divided reference signal, wherein the divided local oscillation signal is substantially equal to the divided reference signal. The frequency divider module, during the process of dividing, divides the local oscillation signal and the reference signal by two to produce 50% duty cycle signals.

In an alternate embodiment, the frequency divider module divides the local oscillation signal by different amounts to produce a first divided local oscillation signal and a second divided local oscillation signal wherein the divided reference signal is substantially centered between first divided local oscillation signal and the second divide local oscillation signal when the VCO is calibrated.

The period-to-voltage conversion module comprises a plurality of period-to-voltage converters, wherein the period-to-voltage conversion module comprises a charge pump coupled in series with a peak detector. Each of the plurality of the period-to-voltage is coupled to receive the divided output from each of the plurality of frequency dividers. The period-to-voltage conversion module, coupled to receive the divided local oscillation and the divided reference signal, converts the divided local oscillation and the divided reference signal to a threshold voltage signal and a reference voltage signal, respectively. In the alternate embodiment, the period-to-voltage conversion module converts the first and second divided local oscillation signals to an upper threshold voltage signal and a lower threshold voltage signal.

The comparator module, comprising a plurality of comparators, is coupled to receive the threshold and reference voltage signals and produces a frequency adjustment signal comprising a binary signal. The frequency adjustment signal comprises a binary signal having at least one of a single bit signal and a multi-bit signal and wherein the binary value of the at least one signal represents an amount of compensation. The single bit signal defines two logic states while the multi-bit signal defines a multi-state, wherein each state defines whether a voltage controlled local oscillation signal frequency should be increased or decreased.

The logic module comprises, in one embodiment, a binary counter that increments or decrements a frequency compensation signal based on the value of the frequency adjustment signal. In an alternate embodiment, combination logic, within the logic module, is coupled to receive a first and second logic signal to produce therefrom, a frequency compensation signal based on a look-up table.

The frequency compensation signal comprises a binary signal having a plurality of values wherein each value of the plurality of values represents a configuration of switched capacitors in a capacitor bank of the VCO. The frequency compensation signal functions to adjust the configuration of switched capacitors coupled to the VCO tuned circuit until the divided local oscillation signal is substantially equal to the reference signal.

The above-referenced description of the summary of the invention captures some, but not all, of the various aspects of the present invention. The claims are directed to some of the various other embodiments of the subject matter towards which the present invention is directed. In addition, other aspects, advantages and novel features of the invention will become apparent from the following detailed description of the invention when considered in conjunction with the accompanying drawings.

BRIEF DESCRIPTION OF THE SEVERAL VIEWS OF THE DRAWINGS

These and other features, aspects and advantages of the present invention will be more fully understood when considered with respect to the following detailed description, appended claims and accompanying drawings wherein:

DETAILED DESCRIPTION OF THE INVENTION

Figure 1:
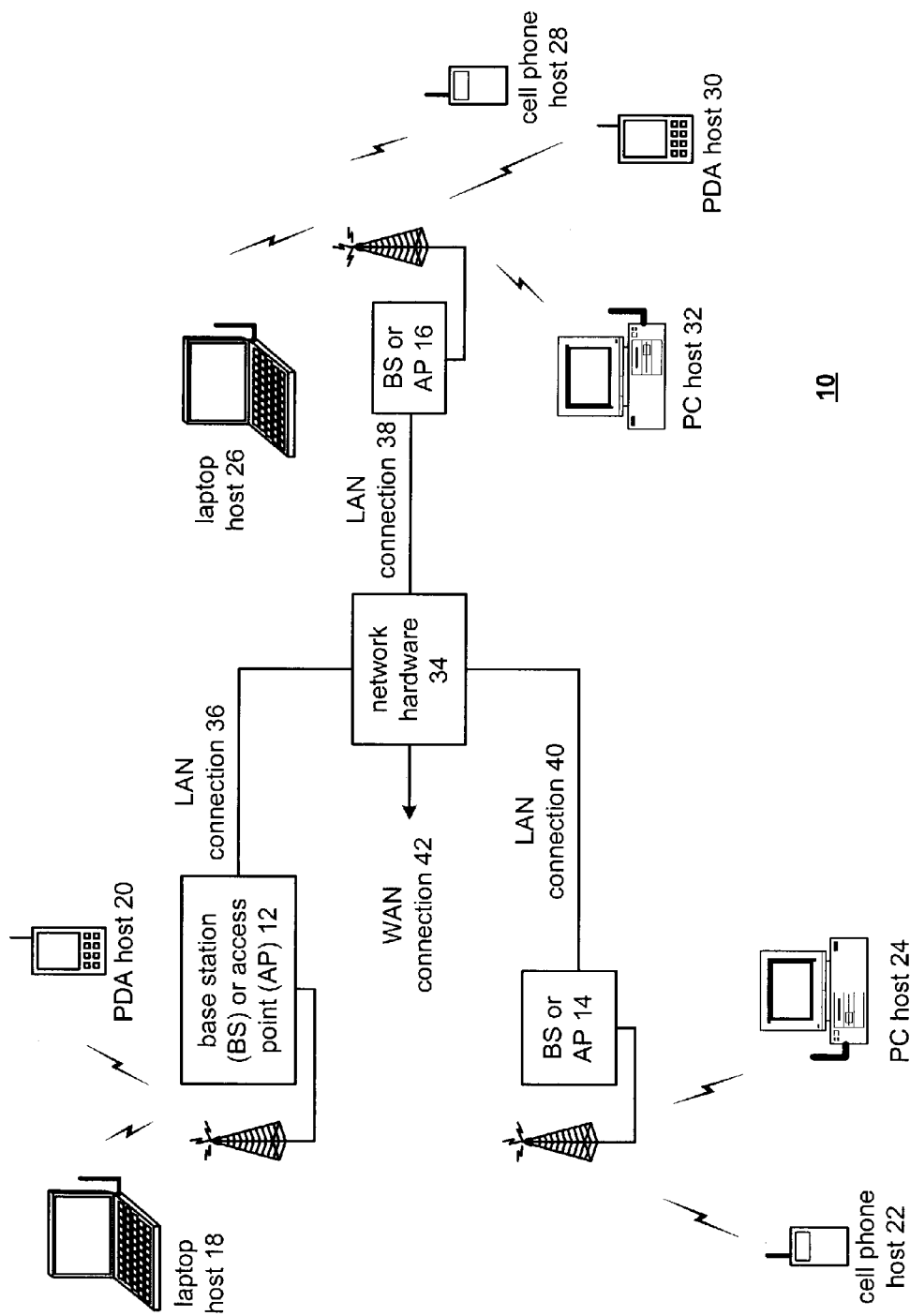
FIG. 1 is a functional block diagram illustrating a communication system that includes a plurality of base stations or access points, a plurality of wireless communication devices and a network hardware component.

FIG. 1 is a functional block diagram illustrating a communication system 10 that includes a plurality of base stations or access points (AP) 12–16, a plurality of wireless communication devices 18–32 and a network hardware component 34. The wireless communication devices 18–32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12–16 are operably coupled to network hardware component 34 via local area network (LAN) connections 36, 38 and 40. Network hardware component 34, which may be a router, switch, bridge, modem, system controller, etc., provides a wide area network connection 42 for communication system 10. Each of the base stations or access points 12–16 has an associated antenna or antenna array to communicate with the wireless communication devices in its area. Typically, wireless communication devices 18–32 register with the particular base stations or access points 12–16 to receive services from communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
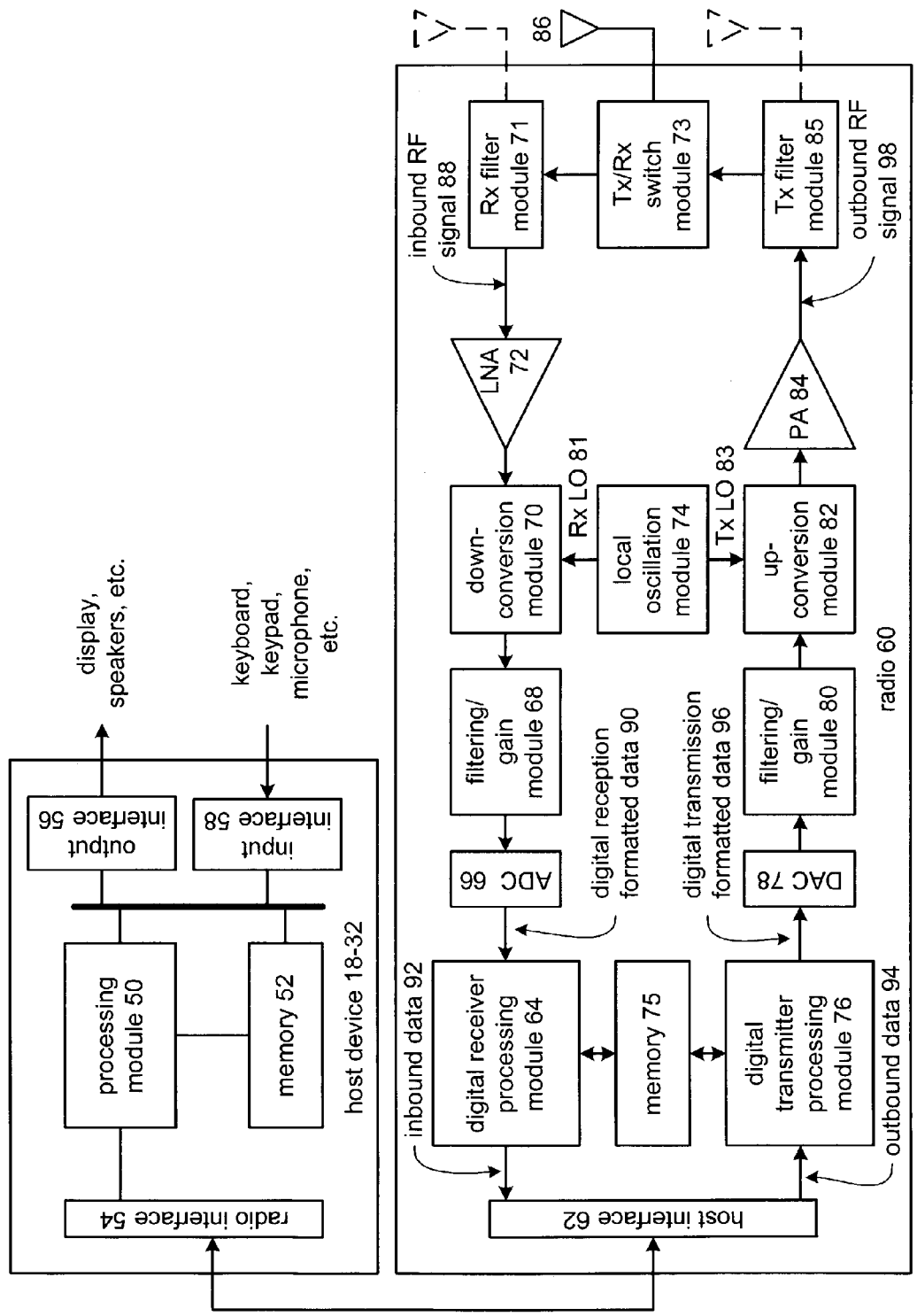
FIG. 2 is a schematic block diagram illustrating a wireless communication host device and an associated radio.

FIG. 2 is a schematic block diagram illustrating a wireless communication host device 18–32 and an associated radio 60. For cellular telephone hosts, radio 60 is a built-in component. For personal digital assistants hosts, laptop hosts, and/or personal computer hosts, the radio 60 may be built-in or an externally coupled component.

As illustrated, wireless communication host device 18–32 includes a processing module 50, a memory 52, a radio interface 54, an input interface 58 and an output interface 56. Processing module 50 and memory 52 execute the corresponding instructions that are typically done by the host device. For example, for a cellular telephone host device, processing module 50 performs the corresponding communication functions in accordance with a particular cellular telephone standard.

Radio interface 54 allows data to be received from and sent to radio 60. For data received from radio 60 (e.g., inbound data), radio interface 54 provides the data to processing module 50 for further processing and/or routing to output interface 56. Output interface 56 provides connectivity to an output device such as a display, monitor, speakers, etc., such that the received data may be displayed. Radio interface 54 also provides data from processing module 50 to radio 60. Processing module 50 may receive the outbound data from an input device such as a keyboard, keypad, microphone, etc., via input interface 58 or generate the data itself. For data received via input interface 58, processing module 50 may perform a corresponding host function on the data and/or route it to radio 60 via radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/Rx) switch module 73, a local oscillation module 74, a memory 75, a digital transmitter processing module 76, a digital-to-analog converter 78, a filtering/gain module 80, an up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

Digital receiver processing module 64 and digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and modulation. Digital receiver and transmitter processing modules 64 and 76, respectively, may be implemented using a shared processing device, individual processing devices, or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when digital receiver processing module 64 and/or digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and digital receiver processing module 64 and/or digital transmitter processing module 76 executes, operational instructions corresponding to at least some of the functions illustrated herein.

In operation, radio 60 receives outbound data 94 from wireless communication host device 18–32 via host interface 62. Host interface 62 routes outbound data 94 to digital transmitter processing module 76, which processes outbound data 94 in accordance with a particular wireless communication standard (e.g., IEEE 802.11a, IEEE 802.11b, Bluetooth, etc.) to produce digital transmission formatted data 96. Digital transmission formatted data 96 will be a digital baseband signal or a digital low IF signal, where the low IF typically will be in the frequency range of one hundred kilohertz to a few megahertz.

Digital-to-analog converter 78 converts digital transmission formatted data 96 from the digital domain to the analog domain. Filtering/gain module 80 filters and/or adjusts the gain of the analog baseband signal prior to providing it to up-conversion module 82. Up-conversion module 82 directly converts the analog baseband signal, or low IF signal, into an RF signal based on a transmitter local oscillation 83 provided by local oscillation module 74. Local oscillation module 74 further contains one or more calibration circuits to adjust the local oscillations to a desired channel or operating frequency. Power amplifier 84 amplifies the RF signal to produce an outbound RF signal 98, which is filtered by transmitter filter module 85. The antenna 86 transmits outbound RF signal 98 to a targeted device such as a base station, an access point and/or another wireless communication device.

Radio 60 also receives an inbound RF signal 88 via antenna 86, which was transmitted by a base station, an access point, or another wireless communication device. The antenna 86 provides inbound RF signal 88 to receiver filter module 71 via Tx/Rx switch module 73, where Rx filter module 71 bandpass filters inbound RF signal 88. The Rx filter module 71 provides the filtered RF signal to low noise amplifier 72, which amplifies inbound RF signal 88 to produce an amplified inbound RF signal. Low noise amplifier 72 provides the amplified inbound RF signal to down-conversion module 70, which directly converts the amplified inbound RF signal into an inbound low IF signal or baseband signal based on a receiver local oscillation 81 provided by local oscillation module 74. Down-conversion module 70 provides the inbound low IF signal or baseband signal to filtering/gain module 68.

Analog-to-digital converter 66 converts the filtered inbound signal from the analog domain to the digital domain to produce digital reception formatted data 90. Digital receiver processing module 64 decodes, descrambles, demaps, and/or demodulates digital reception formatted data 90 to recapture inbound data 92 in accordance with the particular wireless communication standard being implemented by radio 60. Host interface 62 provides the recaptured inbound data 92 to the wireless communication host device 18–32 via radio interface 54.

As one of average skill in the art will appreciate, the wireless communication device of FIG. 2 may be implemented using one or more integrated circuits. For example, the host device may be implemented on a first integrated circuit, while digital receiver processing module 64, digital transmitter processing module 76 and memory 75 may be implemented on a second integrated circuit, and the remaining components of radio 60, less antenna 86, may be implemented on a third integrated circuit. As an alternate example, radio 60 may be implemented on a single integrated circuit. As yet another example, processing module 50 of the host device and digital receiver processing module 64 and digital transmitter processing module 76 may be a common processing device implemented on a single integrated circuit. Further, memory 52 and memory 75 may be implemented on a single integrated circuit and/or on the same integrated circuit as the common processing modules of processing module 50, digital receiver processing module 64, and digital transmitter processing module 76. As will be described, it is important that accurate oscillation signals are provided to mixers and conversion modules. A source of oscillation error is noise coupled into oscillation circuitry through integrated circuitry biasing circuitry. The wireless communication device of FIG. 2 is one that may be implemented to include either a direct conversion from RF to baseband and baseband to RF or for a conversion by way of a low intermediate frequency. In either implementation, however, for up-conversion module 82 and down-conversion module 70, it is required to provide accurate frequency conversion. For down-conversion module 70 and up-conversion module 82 to accurately mix a signal, however, it is important that local oscillation module 74 provide an accurate local oscillation signal for mixing with the baseband or RF by up-conversion module 82 and down-conversion module 70, respectively. Accordingly, local oscillation module 74 includes circuitry for adjusting an output frequency of a local oscillation signal provided therefrom. Local oscillation module 74 receives a frequency correction input that it uses to adjust an output local oscillation signal to produce a frequency corrected local oscillation signal output. While local oscillation module 74, up-conversion module 82 and down-conversion module 70 are implemented to perform direct conversion between baseband and RF, it is understood that the principles herein may also be applied readily to systems that implement an intermediate frequency conversion step at a low intermediate frequency.

Figure 3:
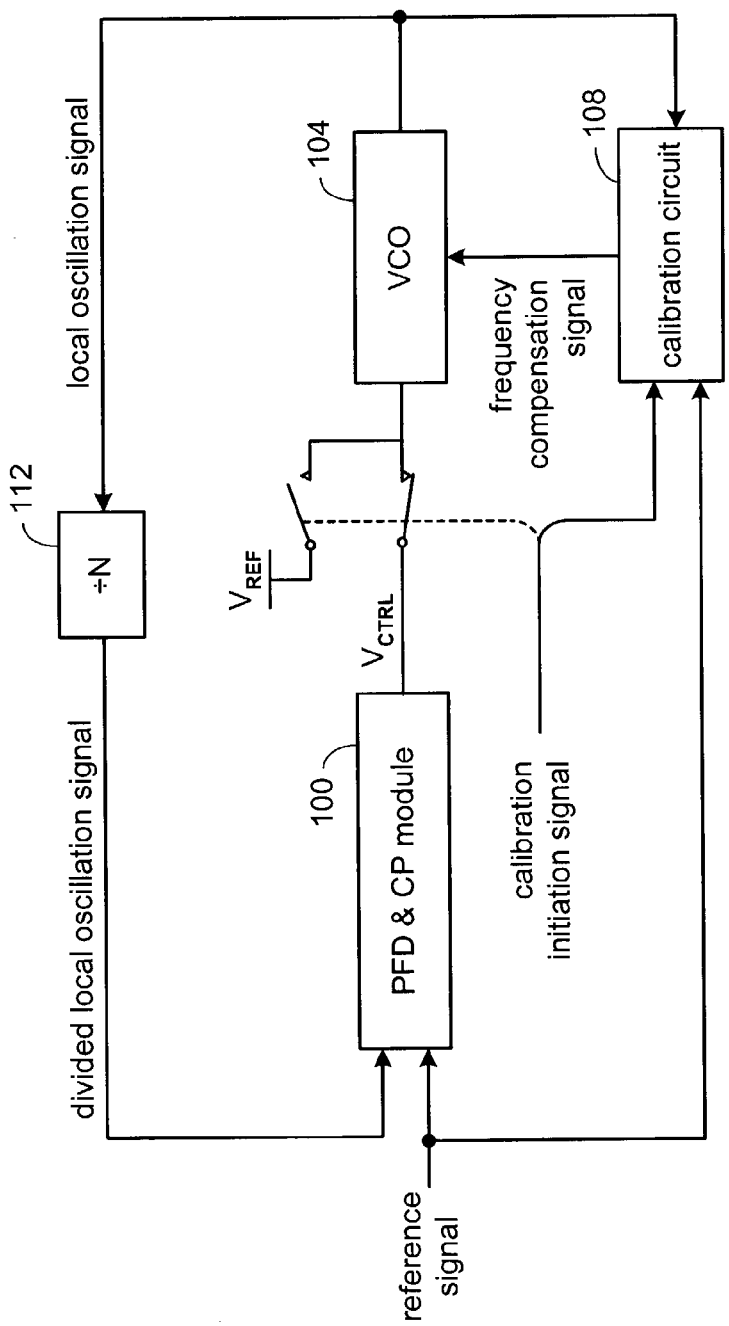
FIG. 3 is a block diagram for a phase-locked loop (PLL) circuit containing a voltage controlled oscillator (VCO) and a calibration circuit for selecting a frequency range of the VCO.

FIG. 3 is a block diagram for a phase-locked loop (PLL) circuit containing a voltage controlled oscillator (VCO) and a calibration circuit for selecting a frequency range of the VCO and for providing initial open loop calibration of the VCO (and PLL). The phase-locked loop comprises a phase frequency detector (PFD) and charge pump (CP) module 100, a voltage controlled oscillator 104 and a frequency divider 112. PFD and CP module 100 provides a control voltage, $V_{CTRL}$, to VCO 104, which produces a local oscillation signal to frequency divider 112. Frequency divider 112 divides the local oscillation signal by a whole number so that the divided local oscillation signal frequency is substantially equal to a reference signal frequency. The divided local oscillation signal produced from frequency divider 112 is coupled to PFD and CP module 100 thereby completing the loop. The PFD and CP module 100 compares the divided local oscillation signal to a reference signal to produce a control voltage, $V_{CTRL}$, that will be proportional to the phase difference between the divided oscillation signal and the reference signal. Wide band and multi-band technology innovations are increasing signal frequencies while decreasing IC circuit dimensions and supply voltages. Voltage controlled oscillators designed for these wide band technologies require a large VCO gain (MHz/volt), or $K_{vco}$, to cover the tuning range of the VCO. Large $K_{vco}$ increases phase noise and spurious signals. It is important, therefore, to design VCOs with low VCO gain. A VCO circuit topology using an integrated inductor, integrated varactor and a capacitor bank comprising a plurality of switched capacitors is therefore favored, as it achieves small $K_{vco}$ due to the small varactor capacitance, while keeping a large overall frequency tuning range due to the plurality of switched capacitors. This implementation, however, requires a calibration circuit to properly select the plurality of switched capacitors for a desired VCO frequency range.

As shown in FIG. 3, a calibration circuit 108 provides a frequency compensation signal to VCO 104. The frequency compensation signal is a binary signal that represents an amount of compensation. More specifically, the binary signal has a plurality of values wherein each value represents a configuration of switched capacitors in the capacitor bank. At the initiation of a calibration cycle, a calibration initiation signal from a baseband processor or other system controller (not shown) will activate a plurality of switches, namely a first loop switch and a second loop switch to open the phase-locked loop circuit and couple a reference voltage to the VCO, respectively. With the phase-locked loop circuit open, the frequency compensation signal coupled from calibration circuit 108 to VCO 104 will select at least one switched capacitor from the plurality of switched capacitors in the VCO to set the VCO local oscillation signal to the frequency of the desired channel. Initially, the reference voltage, $V_{REF}$, is set to one-half of the supply voltage. This control voltage value will set the varactor (voltage variable capacitor) to approximately center of its tuning range so that the switched capacitors can set a coarse tuning range. As may be seen, therefore, the VCO calibration block initially performs open-loop calibration while the VCO is coupled directly to $V_{REF}$ and then performs closed-loop VCO frequency adjustment when the VCO is coupled to receive a $V_{CTRL}$ signal from the PFD and CP 100.

Figure 4:
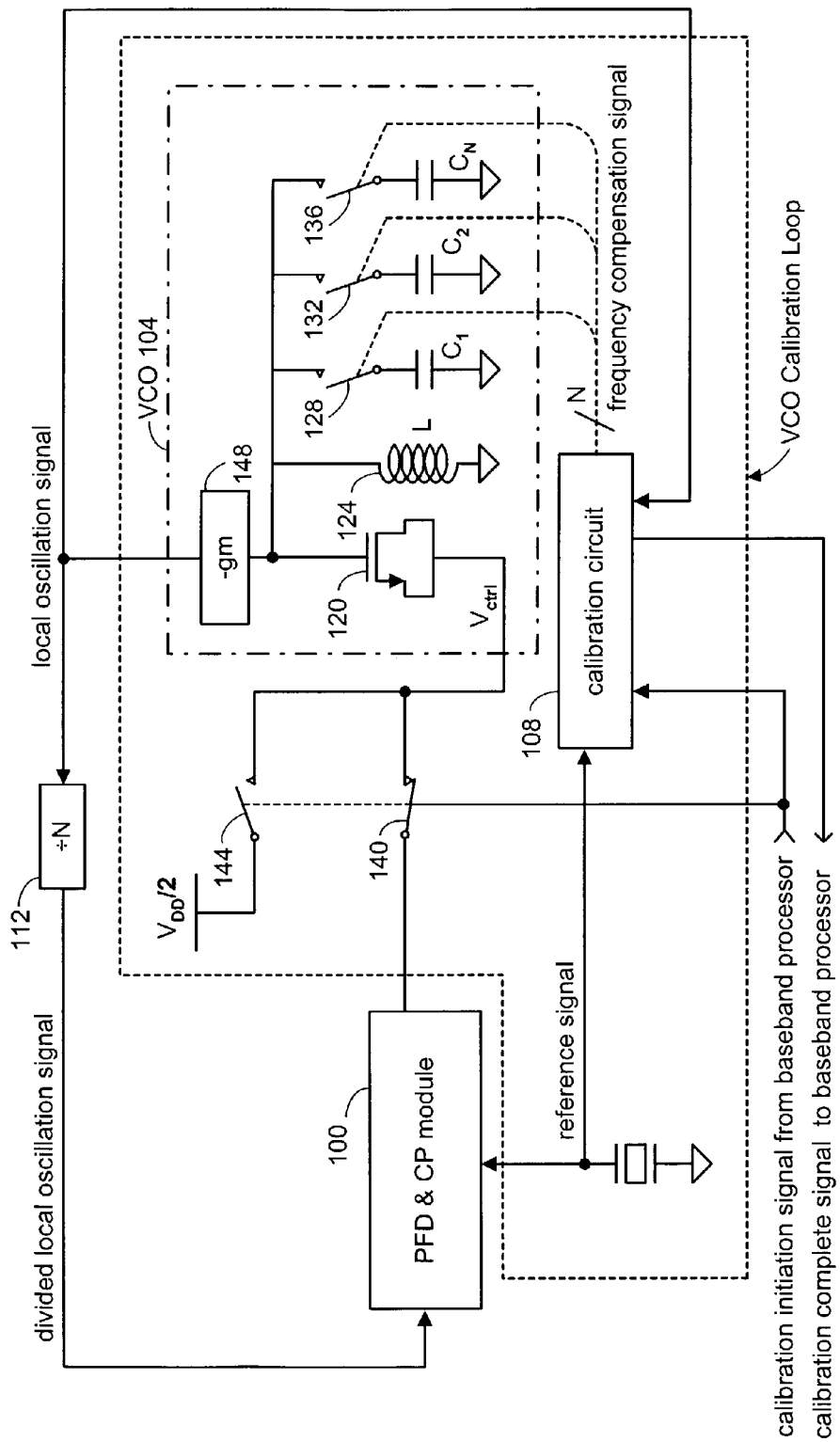
FIG. 4 is a schematic block diagram of the PLL circuit of FIG. 3 illustrating a method and circuit for calibrating a VCO.

FIG. 4 is a schematic block diagram of the PLL circuit of FIG. 3 illustrating a method and circuit for calibrating a VCO. The VCO 104 comprises a transconductance module 148, a voltage variable capacitor (varactor) 120, an inductor 124 and a capacitor bank comprising a plurality of switched capacitors, namely, switched capacitors $C_1$, $C_2$, and $C_N$. A tuned circuit is formed by the combination of inductor 124 which is coupled in parallel with varactor 120 and the plurality of switched capacitors. The tuned circuit oscillates at a frequency based on the square root of the inductance multiplied by the capacitance. Transconductance module 148 which is coupled with the tuned circuit, establishes a bias current for the tuned circuit and further functions to offset circuit losses thereby sustaining oscillation. When the baseband processor or other system processor (not shown) initiates a calibration cycle, the processor activates a plurality of switches, namely, first loop switch 140 and second loop switch 144, for opening the phase-locked loop thereby disconnecting PFD and CP 100 from the VCO and connecting one-half of the supply voltage to VCO 104, respectively. The one-half supply voltage coupled to varactor 120 will set the varactor to approximately one-half of its tuning range. Calibration circuit 108 will initially close at least one switch (as necessary) of the plurality of series (relative to capacitors $C_1$, $C_2$, and $C_N$) connected switches 128–136, to couple the switched capacitors into the VCO tuned circuit to set the local oscillation signal to an approximate one-half of the VCO tuning range. The plurality of switched capacitors, namely, capacitors $C_1$, $C_2$, and $C_N$, are scaled to provide incremental frequency tuning over the total frequency range. Calibration circuit 108, therefore, can search for the desired channel frequency by selectively activating one of the series connected switches 128, 132, and 136 (as necessary). Transconductance module 148 converts an oscillation current into the local oscillation signal and further produces the local oscillation signal from VCO 104 to frequency divider 112 and calibration circuit 108. While the circuits illustrated in the plurality of figures are shown as single ended to simplify discussion, one of average skill in the art can readily appreciate that they can also be formed as differential circuits.

Calibration circuit 108 compares the reference signal to the local oscillation signal to determine if the VCO local oscillation signal frequency is approximately equal to the desired channel frequency, i.e. calibrated. Once the calibration circuit has determined that VCO 104 is properly calibrated, calibration circuit 108 will send a calibration complete signal to the baseband processor or other system processor which will activate second and first loop switches 144 and 140 to remove the one-half supply voltage from the VCO and to close the phase-locked loop circuit and, respectively.

Figure 5:
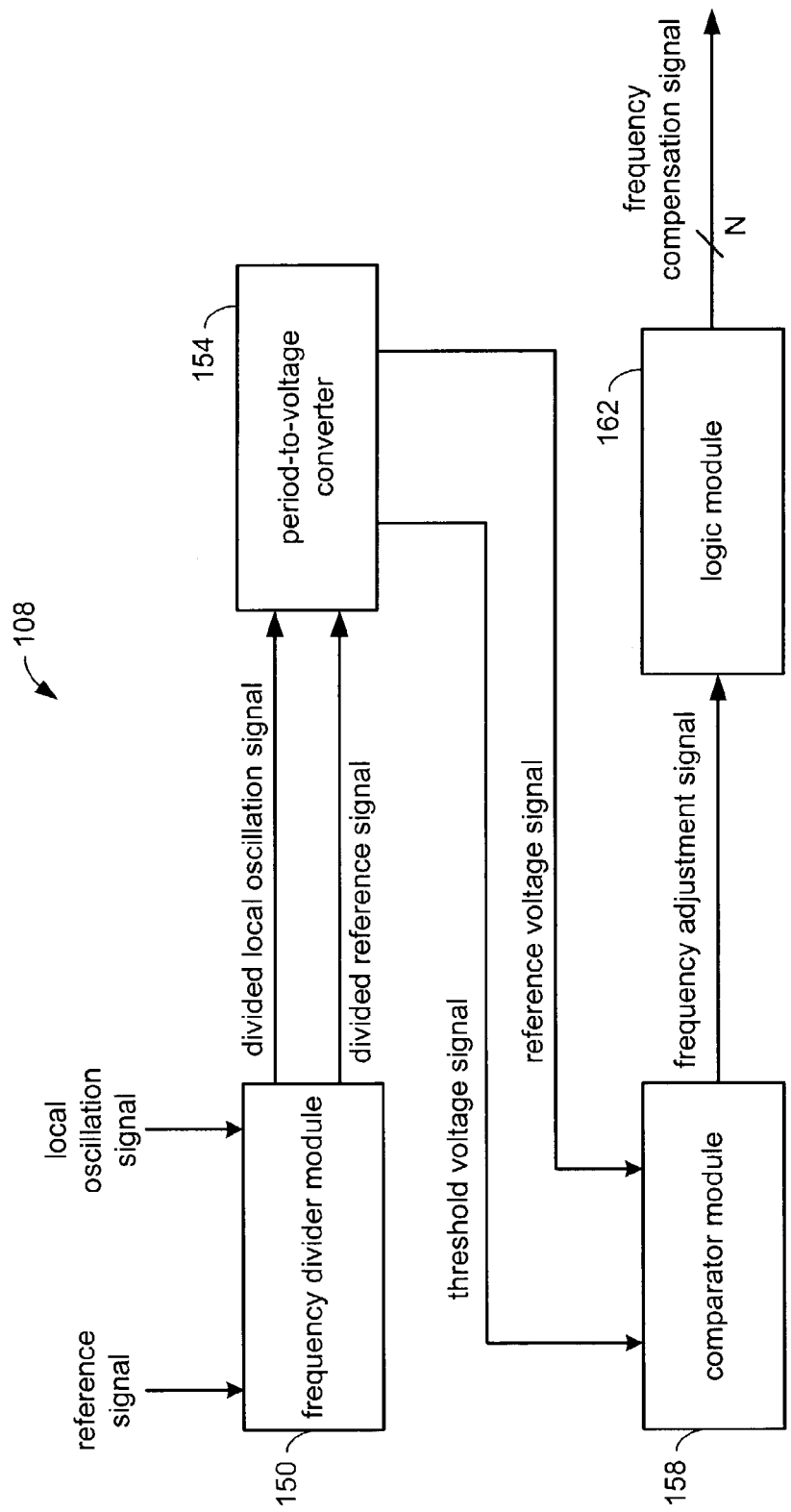
FIG. 5 is a schematic block diagram of the calibration circuit.

FIG. 5 is a schematic block diagram of calibration circuit 108 of FIG. 4. As is shown generally at 108, the calibration circuit comprises a frequency divider module 150, coupled to receive the reference signal and the local oscillation signal, producing therefrom a divided local oscillation signal and a divided reference signal to period-to-voltage converter 154. Period-to-voltage converter 154 produces an output voltage proportional to the period of the received oscillation signals, namely, the divided local oscillation signal and the divided reference signal. Period-to-voltage converter 154 produces a threshold voltage signal and a reference voltage signal, which are proportional to the periods of the divided local oscillation signal and the divided reference signal, respectively, to a comparator module 158. Comparator module 158, coupled to receive the threshold voltage signal and the reference voltage signal, produces a frequency adjustment signal based on the relative values of the threshold voltage signal and the reference voltage signal. Logic module 162, coupled to receive the frequency adjustment signal from comparator module 158, produces a frequency compensation signal comprising a binary signal with a plurality of values. The frequency compensation signal is coupled to the series connected switches 128, 132, and 136 of FIG. 4.

Figure 6:
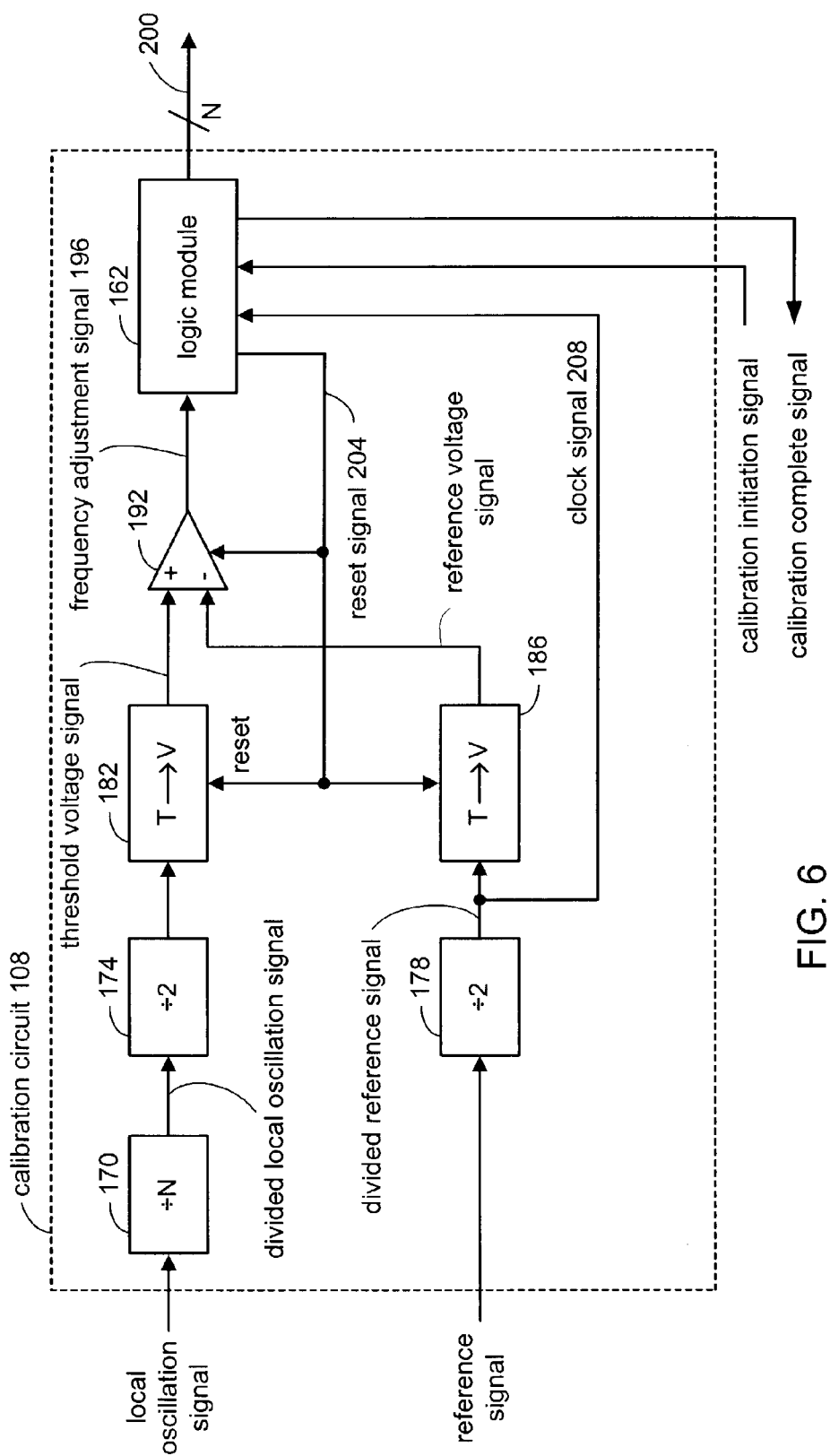
FIG. 6 illustrates a schematic block diagram of the calibration circuit according to one embodiment of the present invention.

FIG. 6 illustrates a schematic block diagram of the calibration circuit according to one is embodiment of the present invention. Calibration circuit 108 comprises a plurality of frequency dividers, a plurality of period-to-voltage converters, at least one comparator, and a logic module. Calibration circuit 108 is coupled to receive the local oscillation signal from the VCO and the reference signal from the PLL into the plurality of frequency dividers, namely, frequency dividers 170, 174 and 178. Frequency divider 170 receives the local oscillation signal and divides the local oscillation signal by a whole number greater than or equal to 1, to produce a divided local oscillation signal having a frequency of oscillation approximately equal to the reference signal frequency of oscillation. The dividing ratio of frequency divider 170 is determined by the desired channel frequency and is typically loaded into the frequency divider before the calibration starts.

Calibration circuit 108 comprises a plurality of period-to-voltage converters, namely, period-to-voltage converters 182 and 186 for converting the received signals into a voltage proportional to the period of the received signal. Since the calibration is based on the comparison of two signal periods, it is important that signal duty cycle not affect the measurement of the signal periods. Therefore, the divided local oscillation signal and the reference signal are divided by two in order to produce a 50% duty cycle. Frequency divider 178 is coupled to receive the reference signal and to produce therefrom a divided reference signal with a 50% duty cycle. Frequency divider 174 divides the divide local oscillation signal by two to produce a 50% duty cycle divide local oscillation signal. The 50% duty cycle signals are coupled into period-to-voltage converters 182 and 186, respectively, which convert the 50% duty cycle received signals into voltages signals proportional to the period of the 50% duty cycle signals.

Period-to-voltage converter 182 produces a threshold voltage signal, which is proportional to the period of the divided local oscillation signal. Period-to-voltage converter 186 produces a reference voltage signal that is proportional to the period of the divided reference signal. The threshold voltage signal and the reference voltage signal are coupled to a comparator 192 for producing a frequency adjustment signal responsive to relative values of the threshold voltage signal and the reference voltage signal. As will be described in more detail, comparator 192 produces a frequency adjustment signal 196, which comprises a binary signal that is either logic 1 or logic zero. Frequency adjustment signal 196 is coupled to logic module 162, which produces a frequency compensation signal 200 therefrom. Logic module 162 additionally produces a calibration complete signal that is coupled to a baseband processor or other system processor when calibration is complete. Additionally, logic module 162 couples a reset signal 204 to comparator 192, and to period-to-voltage converters 182 and 186, to provide a known initial condition prior to starting calibration or when selecting a new switched capacitor configuration. Clock signal 208 received by logic module 162 is produced from the divided reference signal thereby eliminating the need for an external clock and errors associated with using the external clock.

Figure 7:
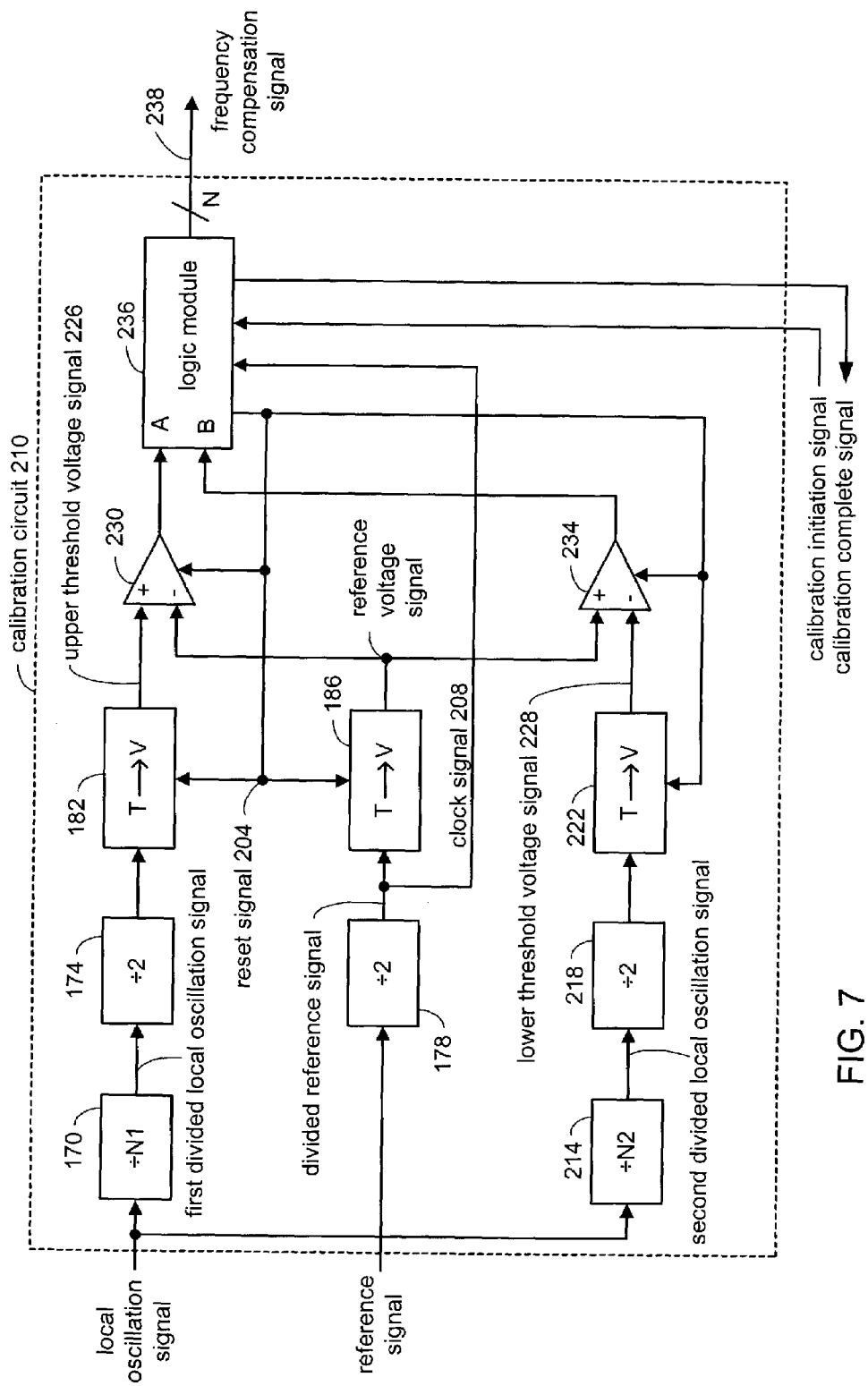
FIG. 7 illustrates a schematic block diagram of the calibration circuit according to an alternate embodiment of the present invention.

FIG. 7 illustrates a schematic block diagram of the calibration circuit according to an alternate embodiment of the present invention. Calibration circuit 210 is coupled to receive the local oscillation signal from the VCO and the reference signal from the phase-locked loop. The local oscillation signal is coupled to a pair of frequency dividers, namely, frequency dividers 170 and 214 to produce a first divided local oscillation signal and a second divided local oscillation signal, respectively. The dividing ratio of frequency dividers 170 and 214, namely, N1 and N2, are not equal and are selected such that the frequencies of the first divided local oscillation signal and the second divided local oscillation signal form an upper frequency boundary and a lower frequency boundary relative to the reference signal received from the phase-locked loop. For example, for a reference signal of 10 MHz and a channel frequency of 1 GHz, frequency divider 170 could be set to divide by 101 to produce a 9.9 MHz signal, while frequency divider 214 could be set to divide by 99 to produce a 10.1 MHz signal, thus providing an upper and lower frequency boundary to the 10 MHz reference signal.

The reference signal is coupled to frequency divider 178 to produce a divided reference signal having a 50% duty cycle. The first and second divided local oscillation signals are further coupled to a plurality of frequency dividers, namely, frequency dividers 174 and 218, to divide the signals by two to produce the 50% duty cycle signals as previously described. The 50% duty cycle signals are further coupled to period-to-voltage converters 182, 186 and 222, to produce voltages proportional to the period of the received signals. Period-to-voltage converter 182, coupled to receive the first divided local oscillation signal, produces an upper threshold voltage signal 226 that is proportional to the period of the first divided local oscillation signal. Period-to-voltage converter 222, coupled to receive the second divided local oscillation signal, produces a lower threshold voltage signal 228 that is proportional to the period of the second divided local oscillation signal. Similarly, period-tovoltage converter 186 produces a reference voltage signal that is proportional to the period of the divided reference signal.

A first comparator 230 is coupled to receive upper threshold voltage signal 226 into a positive port and is further coupled to receive the reference voltage signal into a negative port and to produce therefrom a first logic signal. First comparator 230 is formed to produce a logic 1 signal if upper threshold voltage signal 226 is greater than the reference voltage signal plus a small offset voltage. Likewise, first comparator 230 is formed to produce a logic 0 if the reference voltage signal is greater than upper threshold voltage signal 226. A second comparator 234 is coupled to receive the reference voltage signal into a positive port and coupled to receive lower threshold voltage signal 228 into a negative port. Second comparator 234 will produce a second logic signal that is logic 1 if the reference voltage signal is greater than the lower threshold voltage signal and will further produce the logic 0 level if the lower threshold voltage signal is greater than the reference voltage signal.

First comparator 230 and second comparator 234 are coupled to produce the first logic signal and the second logic signal, respectively, at the logic 1 level when upper threshold voltage signal 226 is greater than the reference voltage level and when lower threshold voltage signal 228 is lower than the reference voltage signal, thereby indicating that the divided reference signal is approximately centered between the first local oscillation signal and the second local oscillation signal further indicating that the calibration is complete. The dividing ratios of frequency divider 170 and frequency divider 214 are selected so that the voltage difference between upper threshold voltage signal 226 and lower threshold voltage signal 228 and the reference voltage signal will be greater than the offset voltage of either comparator 230 or 234.

The first logic signal is coupled from first comparator 230 into an input A of logic module 236 and the second logic signal is coupled from second comparator 234 into an input B of logic module 236. Logic module 236, upon receiving the first logic signal and second logic signal, produces frequency compensation signal 238 comprising a binary signal with a plurality of values. Each value of the plurality of values represents a configuration of switched capacitors in the VCO capacitor bank. Logic module 236 is further coupled to receive a clock signal 208, which is the 50% duty cycle representation of the received reference voltage signal. By using the divided reference signal as a clock signal, the calibration circuit does not need an external clock signal for proper operation, thus reducing the complexity of the integrated circuit and further avoiding errors generated by the external clock signal. As was described previously, frequency compensation signal 238 functions to select at least one switched capacitor from the plurality of switched capacitors of the VCO, thereby changing the frequency of the local oscillation signal.

Figure 8:
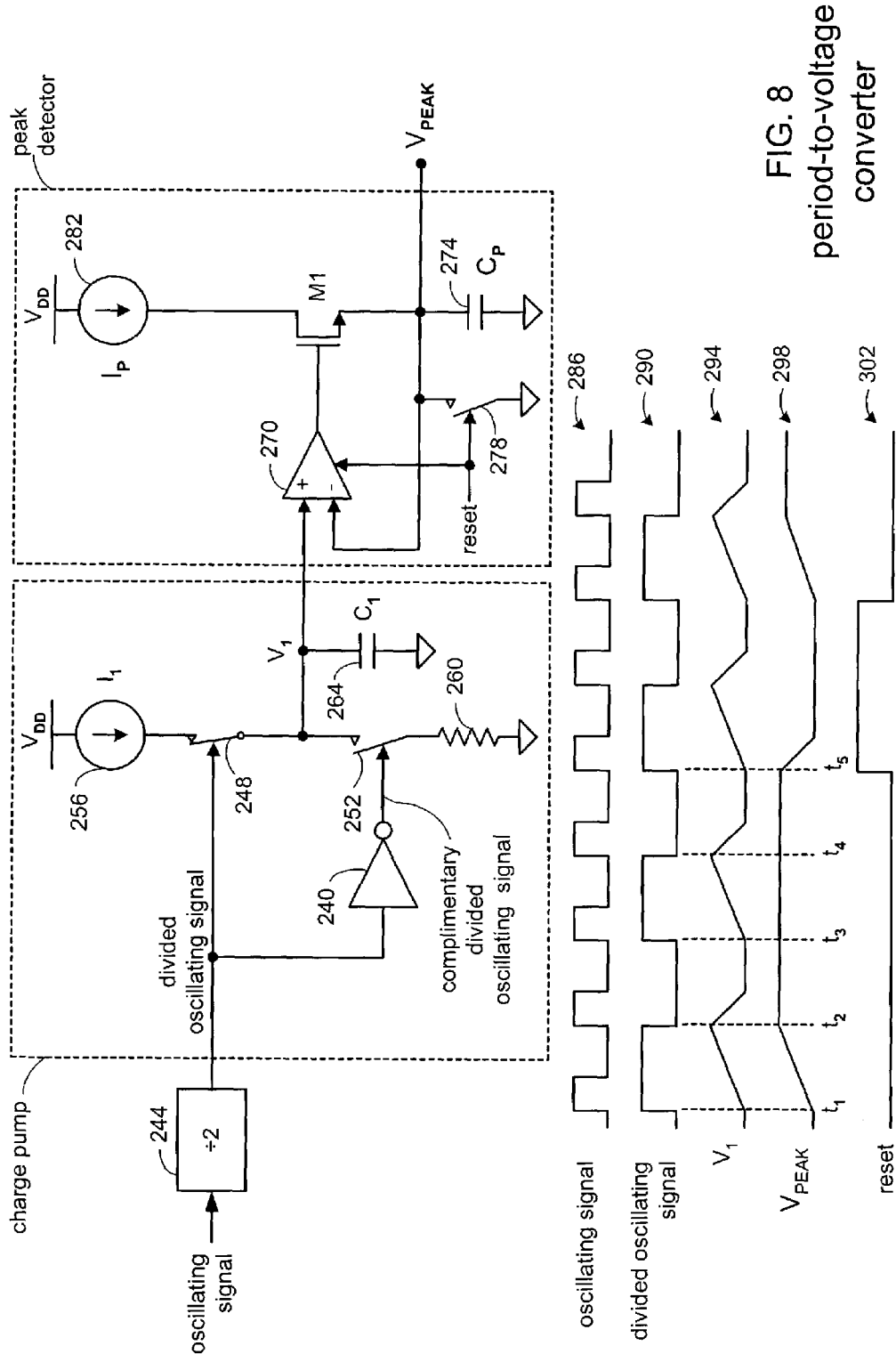
FIG. 8 illustrates a schematic block diagram of a period-to-voltage converter according to one embodiment of the present invention.

FIG. 8 illustrates a schematic block diagram of a period-to-voltage converter according to one embodiment of the present invention. A period-to-voltage converter, comprising a charge pump coupled in series with a peak detector, produces an output voltage that is proportional to the period of an input oscillating signal. As shown in FIG. 8, an oscillating signal, illustrated by signal diagram 286, is divided by two by a frequency divider 244 to produce a divided oscillating signal with a 50% duty cycle, illustrated by signal diagram 290. The divided oscillating signal is coupled to an inverter 240 to produce therefrom a complimentary divided oscillating signal.

A first current source 256 is coupled in series with a first selectable switch 248, a second selectable switch 252, and a resistive element 260 coupled to circuit common. First selectable switch 248 is activated by the divided oscillating signal while second selectable switch 252 is activated by the complimentary divided oscillating signal. A first capacitor-configured MOSFET 264 is coupled between the series connection of first selectable switch 248 and second selectable switch 252 and circuit common. A regular capacitor may also be used in place of a capacitor configured MOSFET. In operation, first selectable switch 248 is closed when second selectable switch 252 is open, and vice versa. When first selectable switch 248 is closed, first capacitor-configured MOSFET 264 charges with current provided by first current source 256. Capacitor-configured MOSFET 264 discharges through resistive element 260 when second selectable switch 252 closes. An output voltage signal developed across first capacitor-configured MOSFET 264 is illustrated by signal diagram 294. The charge pump functions to charge first capacitor-configured MOSFET 264 with a current from first current source 256 during a high level of the divided oscillating signal and to discharge first capacitor-configured MOSFET 264 through second selectable switch 252 and resistive element 260 during a low level of the divided oscillating signal. The charge-discharge cycle will be a function of the period of the divided oscillating signal and the voltage developed across the first capacitor-configured MOSFET 264 will, therefore, be proportional to the period of the divided oscillating signal, i.e., a longer period allows the capacitor more time to charge and therefore reach a higher voltage level. First current source 256 and first capacitor-configured MOSFET 264 are formed to meet a desired charge-discharge rate according to an expected oscillating signal. In an alternate embodiment first current source 256 and first capacitor-configured MOSFET 264 are formed to be programmable.

The voltage developed across first capacitor-configured MOSFET 264 is coupled to a positive input port on a comparator 270. In the described embodiment of the invention, comparator 270 comprises an amplifier. A negative input port of comparator 270 is coupled to a second capacitor-configured MOSFET 274 (or regular capacitor) and to a source of MOSFET M1. In operation, any initial voltage on second capacitor-configured MOSFET 274 is discharged as a result of a reset signal closing selectable reset switch 278, thereby providing an initial discharge condition. Comparator 270 will produce a voltage at an output port that is coupled to a gate of MOSFET M1. This voltage will be at a value that biases MOSFET M1 into saturation or into an off state (not necessarily $V_{DD}$ or circuit common). When biased into saturation, MOSFET M1 will conduct current from a second current source 282 coupled to a drain of MOSFET M1. The current conducted by MOSFET M1 will be coupled from the MOSFET M1 source to second capacitor-configured MOSFET 274 thereby charging the capacitor.

The peak voltage developed across second capacitor-configured MOSFET 274 will be a function of the period of the divided oscillating signal. Current supplied by second current source 282 affects the charge rate but not the final value. The peak voltage developed across second capacitor-configured MOSFET 274 will, within a few cycles, be substantially equal (ignoring any small comparator offset voltage) to the output voltage signal developed across first capacitor-configured MOSFET 264. Once the peak voltage ($V_{PEAK}$), coupled to the negative port of comparator 270, is equal to the voltage coupled to the positive port, the output port will drop until turning MOSFET M1 off. The peak voltage developed across second capacitor-configured MOSFET 274 will be held until discharged by selectable reset switch 278.

Signal diagrams 286–302 illustrate the voltage waveforms of period-to-voltage converter. The oscillating signal received by frequency divider 244 is shown in timing diagram 286. Frequency divider 244 produces a divided oscillating signal with a 50% duty cycle as shown by timing diagram 290. The output voltage signal, $V_1$, developed across first capacitor-configured MOSFET 264 will charge during the high level portion of the divided oscillating signal, commencing at time $t_1$, and then discharge during the low level portion of the divided oscillating signal, starting at time $t_2$, as shown by signal diagram 294. The peak output voltage signal, $V_{PEAK}$, will charge up during the high level portion of the divided oscillating signal, time $t_1$ to time $t_2$, and maintain the peak voltage during the low level portion of the divided oscillating signal, time $t_2$ to time $t_3$, as is also shown by signal diagram 298.

On the next high level portion of divided oscillating signal, starting at time $t_3$, the peak output voltage, $V_{PEAK}$, will continue to charge until it is substantially equal to output voltage signal $V_1$. One advantage of the present invention is conversion speed. The peak output voltage, $V_{PEAK}$, will be substantially equal to the output voltage signal $V_1$ within a few cycles of the divided oscillating signal. A reset signal shown in timing diagram 302, starting at time $t_5$, is used to discharge second capacitor-configured MOSFET 274 and comparator 270 to set the initial connections to zero for the next conversion cycle. The peak output voltage signal developed across second capacitor-configured MOSFET 274 will be coupled to a comparator, as was discussed with reference to FIG. 7. As is known by one of average skill in the art, switches 248, 252, and 278 may be formed in a variety of techniques, including analog MOSFET switches.

Figure 9A:
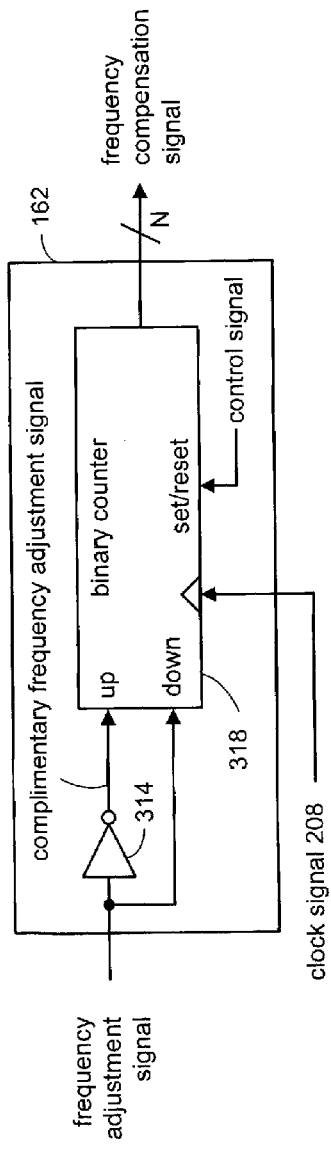
FIGS. 9A and 9B illustrate logic modules according to embodiments of the present invention.
Figure 9B:
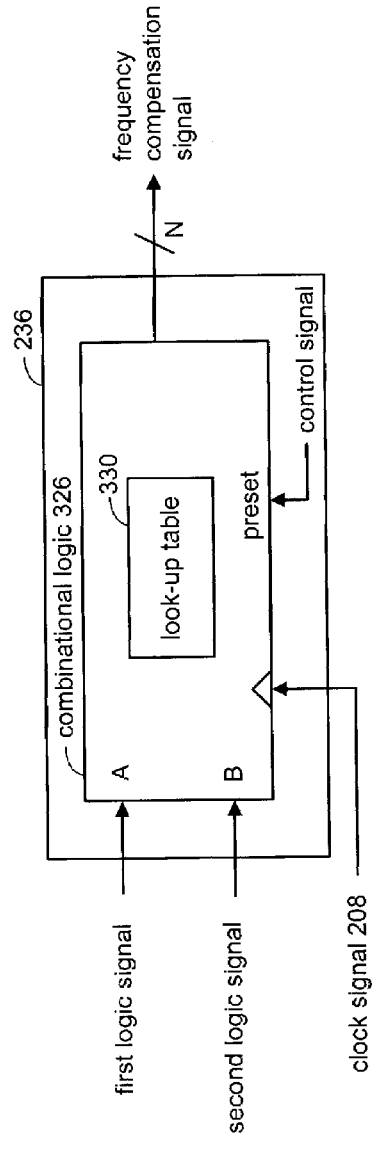

FIGS. 9A and 9B illustrate logic modules according to embodiments of the present invention. FIG. 9A represents logic module 162 of FIG. 6 while FIG. 9B represents logic module 236 of FIG. 7. The logic module of FIG. 9A receives a frequency adjustment signal and a clock signal, as was previously described. Logic module 162 comprises an inverter 314 and a binary counter 318. The frequency adjustment signal that is coupled into logic module 162 is coupled to a down input and to inverter 314, which produces a complimentary frequency adjustment signal further coupled to an up input. In operation, binary counter 318 will count up or count down, depending on the polarities of the signals on the up and down inputs during the rising edge of clock signal 208. When the frequency adjustment signal is at a high level, the period of the local oscillation signal is greater than the period of the reference signal, i.e., the local oscillation signal frequency is lower than the reference signal frequency.

The high level frequency adjustment signal coupled to the down input of binary counter 318 causes binary counter 318 to decrement on the rising edge of the next clock cycle, reducing the binary value of the frequency compensation signal which switches less capacitance into the VCO circuit thus increasing the local oscillation signal frequency produced by the VCO circuit. Conversely, when the frequency adjustment signal is at a low level, inverter 314 produces a high level at the up input of binary counter 318, increasing the binary count of the frequency compensation signal thereby increasing capacitance in the tuning circuit of the VCO to lower the frequency of the local oscillation signal produced by VCO circuitry.

Binary counter 318 receives a logic module control signal coupled to a set/reset input. At the start of the calibration, the control signal will set or clear the binary value of the frequency compensation signal to select the switched capacitor configuration of the VCO. For example, depending on the design implementation, the binary value can be set to couple all of the switched capacitors to the VCO tuned circuit (lowest VCO frequency) or the binary value can be cleared to remove all the switched capacitors from the VCO tuned circuit (highest VCO frequency). During the calibration, the binary counter will count down (or up) until the frequency adjustment signal changes states (low-to-high or high-to-low) indicating the calibration is complete.

FIG. 9B illustrates logic module 236 from FIG. 7. Logic module 236 of FIG. 9B, comprises combinational logic 326, including a look-up table 330. The first logic signal and second logic signal of FIG. 7 are coupled into input ports A and B of combinational logic 326. Look-up table 330 illustrates the four possible states available for a two-input signal. Combinational logic 326 uses the status produced from look-up table 330 to set a binary value of a multi-bit frequency compensation signal. The frequency compensation signal comprises a plurality of values wherein each value represents a configuration of the switched capacitors of the VCO. At the start of the VCO calibration, a logic module control signal will preset the binary value of the multi-bit frequency compensation signal to the approximate center of the VCO tuned circuit range. If, for example, the frequency compensation signal is a 3-bit signal, then the binary value will be preset to "011" (or alternatively to "100") which will couple approximately one-half of the switched capacitors to the VCO tuned circuit, thereby setting the VCO local oscillation signal frequency to the center of the tuning range. During the VCO calibration, the multi-bit frequency compensation signal binary value will be increased or decreased by combinational logic 326 to alter the switched capacitor-configuration thereby changing the VCO oscillating frequency.

When first logic signal and second logic signal, coupled to input ports A and B, respectively, are both logic 1, the reference voltage signal is lower than the upper threshold voltage and greater than the lower threshold voltage. In this condition, the VCO is calibrated and calibration loop is exited. This condition is illustrated in row 334 of look-up table 330. When either logic level coupled to input ports A and B is a logic one, combinational logic 326 produces the frequency compensation signal with a value set to either increase or decrease capacitance according to look-up table 330. These two conditions are illustrated in rows 336 and 338 of look-up table 330. An error condition exists when both logic levels coupled to input ports A and B are logic zero, as illustrated by signal 340 of look-up table 330. This condition states that the reference signal is greater than the upper threshold voltage signal and less than the lower threshold signal. Since this condition is not possible without an error in the circuit, logic module 236 will notify the baseband processor or other system controller of this error. The polarity of the first logic signal and the second logic signal of look-up table 330 is exemplary. One of average skill in the art can appreciate the various logic combinations required to produce alternate polarities.

Figure 10:
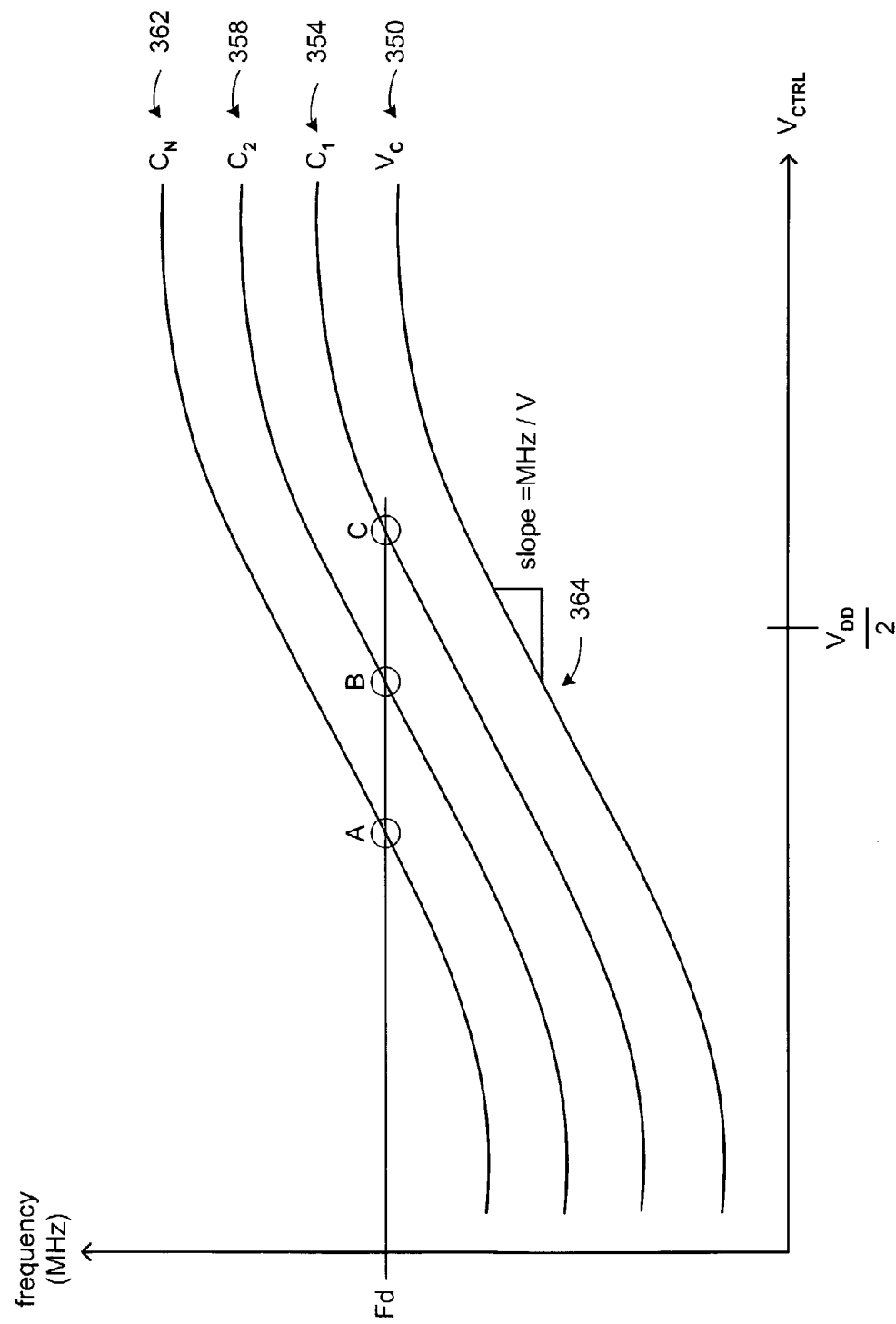
FIG. 10 illustrates a plurality of tuning curves for the switched capacitors responsible for tuning the VCO circuit.

FIG. 10 illustrates a plurality of tuning curves for the switched capacitors responsible for tuning the VCO circuit of FIG. 3. As can be seen in FIG. 10, each curve represents a specific tuning range or frequency range responsive to the control voltage, $V_{CTRL}$. A tuning curve 350 corresponds to a tuning range provided by varactor 120 of FIG. 4. Conversely, tuning curves 354–362 correspond to a tuning range provided by switched capacitors $C_1$, $C_2$ and $C_N$, respectively. One advantage of using switched capacitors in conjunction with a varactor can be seen in FIG. 10, wherein the slope of the linear portion of the tuning curves, shown generally at 364, is lower than the slope of a single curve required to tune across the entire frequency of interest. As the dividing ratios of FIGS. 6 and 7 are changed to correspond to a specific channel frequency, the VCO calibration circuitry will optimally find a tuning curve, namely, one of tuning curves 350 through 362, wherein the frequency of interest will be ideally located on the linear portion of the curve, and the control voltage, $V_{CTRL}$, will be approximately equal to one-half of the supply voltage, $V_{DD}/2$. Another advantage is that a desired frequency can be located within the tuning range of multiple tuning curves. For example, the desired frequency, Fd, can be found at points A, B, and C on curves 362, 358, and 354, respectively. The slope of the tuning curves shown in FIG. 10, represent a lower VCO gain which results in lower phase noise and better spurious signal suppression. While these slopes illustrated are exemplary, they do represent the method of the present invention.

Figure 11:
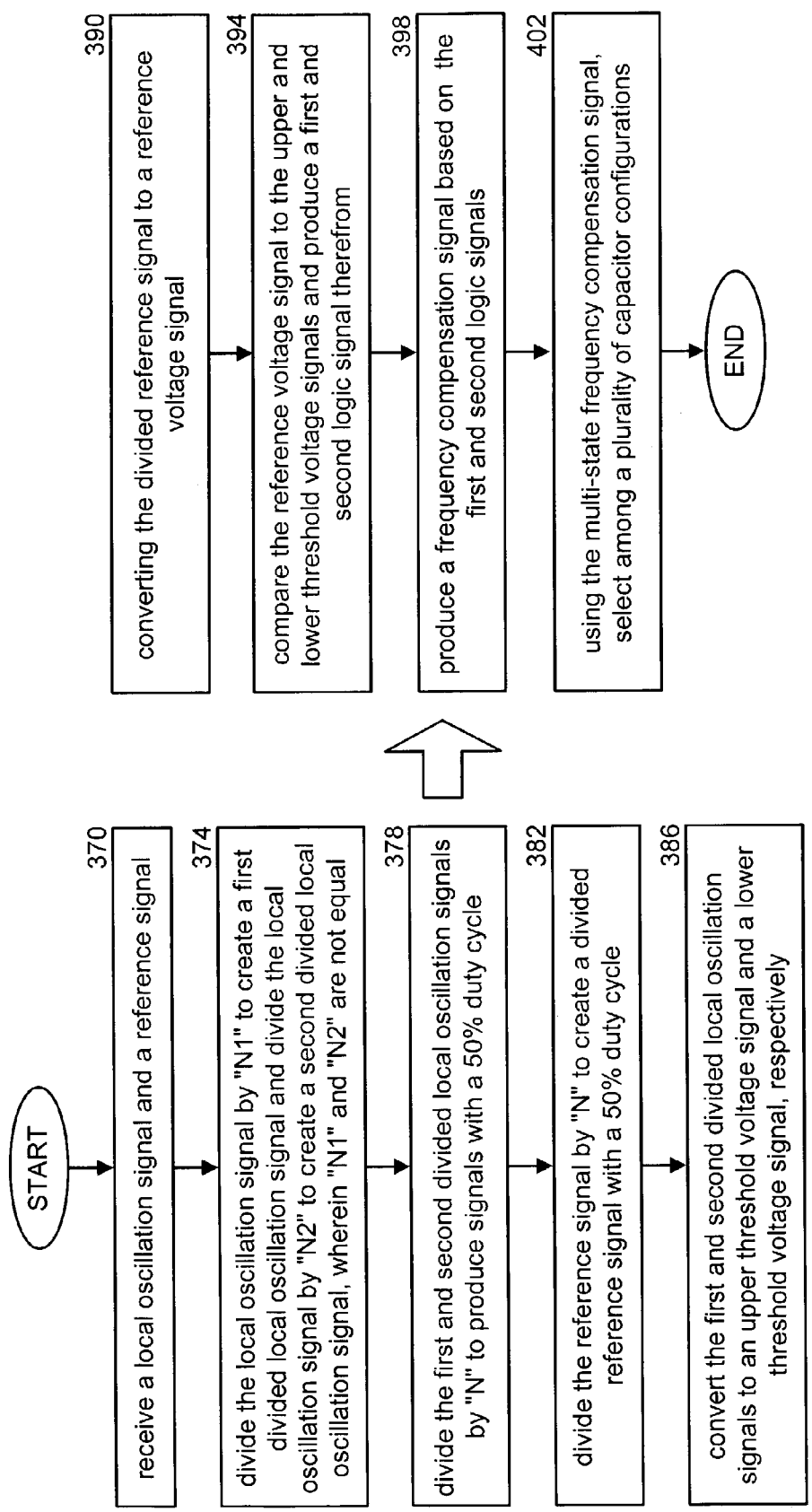
FIG. 11 illustrates a VCO calibration method according to one embodiment of the present invention.

FIG. 11 illustrates a VCO calibration method according to one embodiment of the present invention. A calibration circuit receives a local oscillation signal and a reference signal (step 370) from the VCO and from a PLL, respectively. The local oscillation signal and the reference signal are coupled to a frequency divider module wherein the local oscillation signal is divided by "N1" to create a first divided local oscillation signal and the local oscillation signal is also divided by "N2" to create a second divided local oscillation signal, wherein "N1" and "N2" are not equal (step 374). The divisors "N1" and "N2" are selected to produce divided output frequencies that are higher and lower, respectively, than the reference signal. The divisors "N1" and "N2" are typically loaded into the frequency divider module prior to the start of the calibration cycle. The first and second divided local oscillation signals are further divided by "2" to produce a signal with a 50% duty cycle (step 378). The reference voltage signal is divided by "2" to produce a divided reference signal with a 50% duty cycle (step 382). Converting the first and second divided local oscillation signals and the divided reference signal to 50% duty cycle signals removes uncertainties associated with comparing signals with different duty cycles.

The first and second divided local oscillation signals are converted to an upper threshold voltage signal and a lower threshold voltage signal, respectively (step 386) by a period-to-voltage converter. The output of the period-to-voltage converter will be a voltage proportional to the period of an input signal. The divided reference signal is also converted to a reference voltage signal (step 390) by a period-to-voltage converter.

The reference voltage signal is compared to both the upper and lower threshold voltage signals to produce a first and second logic signal therefrom (step 394). The first and second logic signals comprise a plurality of values that indicate when the local oscillation signal is lower than the reference signal, higher than the reference signal, or approximately equal to the reference signal. A logic module coupled to receive the first and second logic signals, produces a frequency compensation signal based on the first and second logic signals (step 398). The frequency compensation signal comprises a multi-state signal for selecting among a plurality of capacitor configurations (step 402). Each value of the plurality of values selects a switched capacitor configuration into a VCO tuned circuit to select a tuning range for the VCO.

Figure 12A:
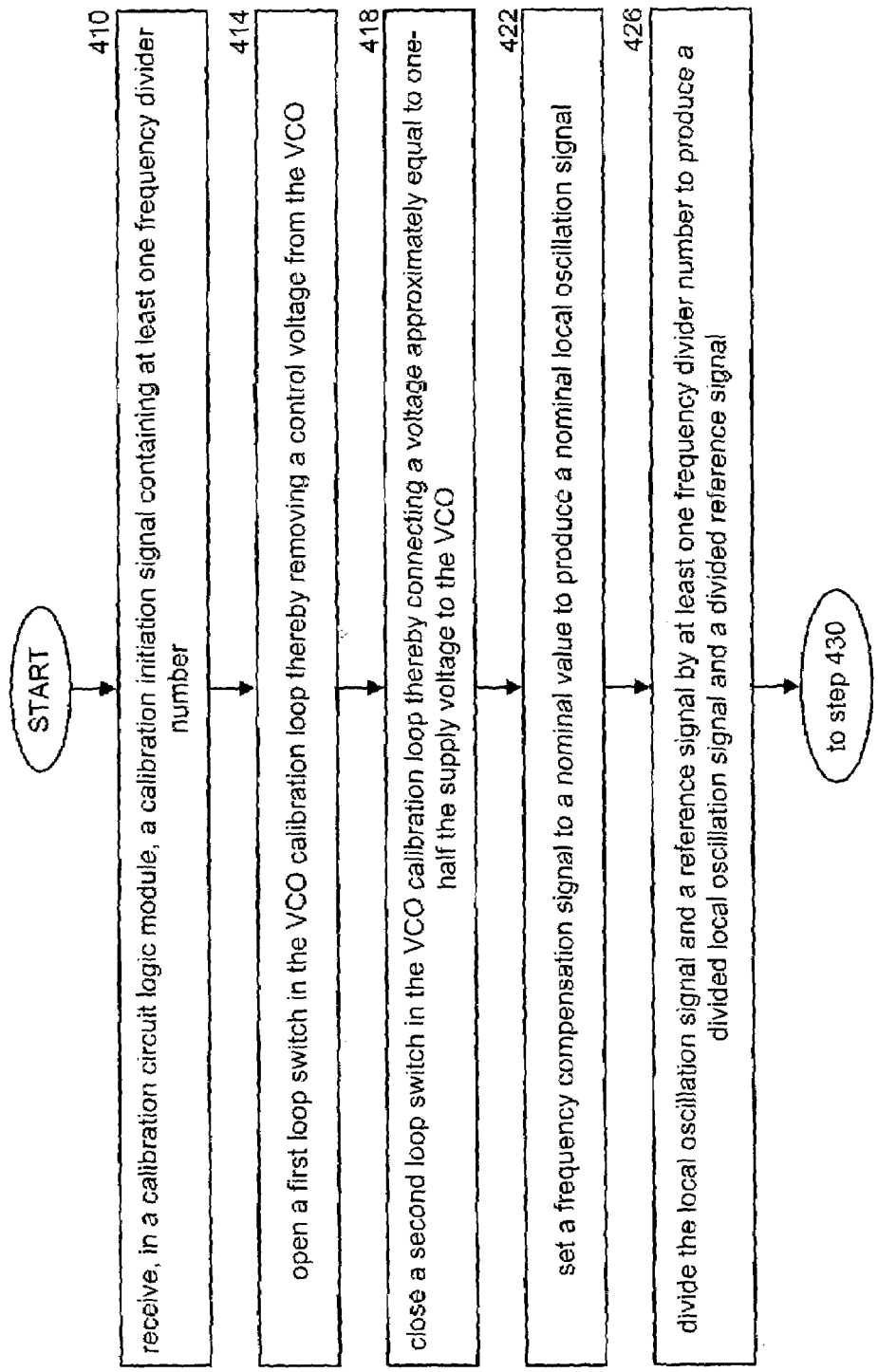
FIGS. 12A and 12B illustrates a VCO calibration method according to an alternate embodiment of the present invention.
Figure 12B:
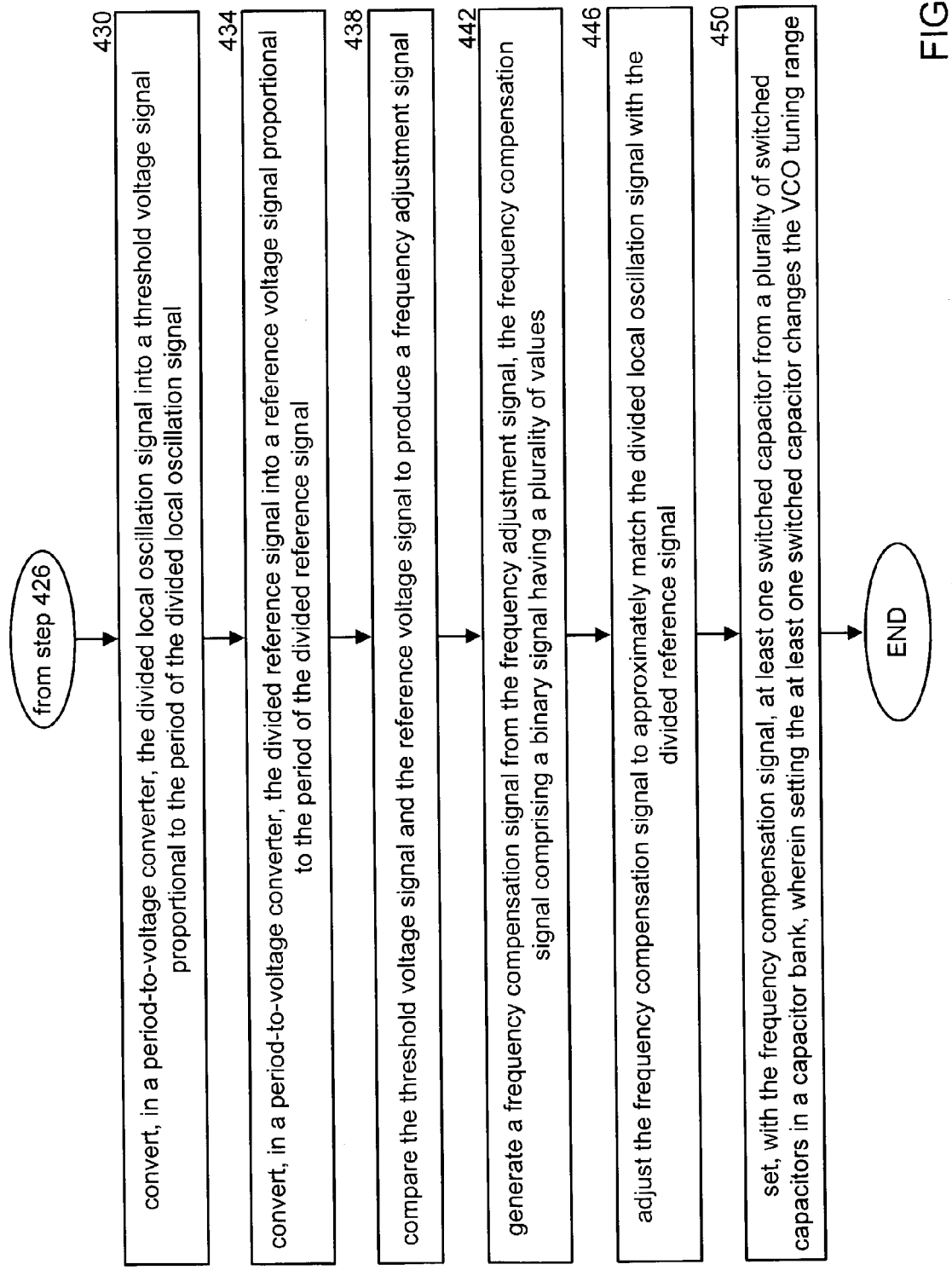

FIGS. 12A and 12B illustrates a VCO calibration method according to an alternate embodiment of the present invention. A calibration circuit logic module receives a calibration initiation signal, typically from a baseband processor or other system processor, containing at least one frequency divider number (step 410). The at least one frequency divider number is loaded into at least one frequency divider to set the frequency of the divided output relative to the input. The baseband or other system processor opens a first loop switch in the VCO calibration loop thereby removing a control voltage from the VCO (step 414), then closes a second loop switch in the VCO calibration loop to couple a voltage approximately equal to the one-half of the supply voltage to the VCO (step 418). The one-half supply voltage coupled to the VCO sets a varactor to approximately one-half of its tuning range. The logic module sets the frequency compensation signal to a nominal value to produce a nominal local oscillation signal (step 422). The frequency compensation signal nominal value couples one of all of the switched capacitors or none of the switched capacitors into the tuned circuit which sets the VCO frequency to the lowest VCO frequency or the highest VCO frequency, respectively.

A received local oscillation signal and a received reference signal are divided by at least one frequency divider number to produce a divided local oscillation signal and a divided reference signal (step 426). The at least one frequency divider number is selected so that the divided local oscillation signal is approximately equal to the reference signal. The divided local oscillation signal and the reference signal are further divided by two to produce a 50% duty cycle divided local oscillation signal and a 50% duty cycle divided reference signal.

The 50% duty cycle divided local oscillation signal is coupled to a period-to-voltage converter where it is converted to a threshold voltage signal proportional to the divided local oscillation signal (step 430). The 50% duty cycle divided reference signal is coupled to a period-to-voltage converter where it is converted to a reference voltage signal proportional to the divided reference signal (step 434). The divided local oscillation signal and the divided reference signal are converted to 50% duty cycle signals to make the period-to-voltage converters insensitive to the duty cycles of the original signals.

The threshold voltage signal and the reference voltage signal are coupled to a comparator where they are compared to produce a frequency adjustment signal (step 438). The output of the comparator is a single bit binary signal. Since the single bit binary signal has only two possible values, the threshold voltage signal and the reference voltage signal are considered equal when the single bit binary signal changes states from low to high or from high to low.

The frequency adjustment signal is coupled to a logic module which generates a frequency compensation signal from the frequency adjustment signal, the frequency compensation signal comprising a binary signal having a plurality of values (step 442). In one embodiment, the frequency compensation signal is produced from a binary counter which increments or decrements the binary signal value responsive to the frequency adjustment signal. Thus, the binary counter adjusts the frequency compensation signal to approximately match the divided local oscillation signal with the divided reference signal (step 446). The binary value of the frequency compensation signal sets at least one switched capacitor from a plurality of switched capacitors in a capacitor bank, wherein setting the at least one switched capacitor changes the VCO tuning range (step 450). When the divided local oscillation signal is lower in frequency than the divided reference signal, the total number of switched capacitors coupled to the tuned circuit are reduced thereby reducing the capacitance to increased the divided local oscillation signal frequency. Conversely, increasing the number of switched capacitors in the VCO tuned circuit, lowers the VCO oscillating frequency.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A calibration circuit for a phase locked loop for selecting the frequency of a voltage controlled oscillator (VCO), the calibration circuit comprising:
  a frequency divider module coupled to receive a local oscillation signal from the VCO and a reference signal, the frequency divider module producing a divided local oscillation and a divided reference signal, wherein the local oscillation signal and the reference signal are divided by different values to produce a divided oscillation signal substantially equal to the divided reference signal;
  a period-to-voltage conversion module coupled to receive the divided local oscillation and the divided reference signal, the period-to-voltage module to convert the divided local oscillation and the divided reference signal to a threshold voltage signal and a reference voltage signal, respectively;
  a comparator module coupled to receive the threshold and reference voltage signals, the comparator module for comparing the threshold and reference voltage signals and for producing a frequency adjustment signal; and
  a logic module coupled to receive the frequency adjustment signal, the logic module for producing a frequency compensation signal responsive to the frequency adjustment signal.

2. The calibration circuit of claim 1 wherein the frequency adjustment signal comprises a binary signal having at least one of a single bit signal and a multi-bit signal and wherein the binary value of the at least one signal represents an amount of compensation.

3. The calibration circuit of claim 2 wherein the single bit signal defines two logic states and wherein the multi-bit signal defines whether a voltage controlled local oscillation signal frequency should be increased or decreased.

4. The calibration circuit of claim 1 wherein the logic module comprises one of a binary counter and combinational logic, and wherein the logic module produces the frequency compensation signal.

5. The calibration circuit of claim 4 wherein the frequency compensation signal comprises a binary signal having a plurality of values wherein each value of the plurality of values represents a configuration of switched capacitors in a capacitor bank of the VCO.

6. The calibration circuit of claim 1 wherein the frequency divider module comprises a plurality of frequency dividers wherein each of the plurality of frequency dividers divides the received local oscillation signal by a different amount.

7. The calibration circuit of claim 1 wherein the period-to-voltage conversion module comprises a plurality of period-to-voltage converters, one coupled to receive the divided output from each of the frequency dividers.

8. The calibration circuit of claim 7 wherein the period-to-voltage conversion module comprises a charge pump coupled in series with a peak detector.

9. The calibration circuit of claim 8 wherein the charge pump comprises a first current source coupled in series with a pair of complementarily selectable switches, also coupled in series with each other and with a resistive element coupled to circuit common, and wherein the first current source is one of a fixed current value and a programmable current value.

10. The calibration circuit of claim 9 wherein a first capacitor-configured MOSFET is coupled between the pair of complementarily selectable switches and circuit common and wherein the first capacitor-configured MOSFET is one of a fixed capacitance value and a programmable capacitance value.

11. The calibration circuit of claim 10 wherein a first of the selectable switches is coupled to receive a divided oscillating signal and wherein a second of the selectable switches is coupled to receive a complementary divided oscillating signal produced by an inverter that is further coupled to receive the divided oscillating signal.

12. The calibration circuit of claim 7 wherein the peak detector is coupled to receive an output voltage signal from the charge pump and a reset signal wherein the peak detector produces a peak output voltage signal that reflects a peak value of the output voltage signal received from the charge pump so long as the reset signal is not received.

13. The calibration circuit of claim 7 wherein the peak detector comprises an amplifier having a positive input port coupled to receive an output voltage signal from the charge pump, an output port coupled to a gate terminal of a MOSFET, a current source coupled between a drain terminal of the MOSFET and a supply voltage, a capacitor coupled between a source terminal of the MOSFET and circuit common, a negative input port coupled to the MOSFET source terminal, and a selectable reset switch coupled across the capacitor.

14. A method for calibrating a voltage controlled oscillation, comprising:
  receiving a local oscillation signal and a reference signal;
  dividing the local oscillation signal by "N1" to create a first divided local oscillation signal and dividing the local oscillation signal by "N2" to create a second divided local oscillation signal, wherein "N1" and "N2" are not equal;
  dividing the reference signal by "N" to create a divided reference signal;
  converting the first and second divided local oscillation signals to an upper threshold voltage signal and a lower threshold voltage signal, respectively;
  converting the divided reference signal to a reference voltage signal;
  comparing the reference voltage signal to the upper and lower threshold voltage signals and producing a first and second logic signal therefrom; and
  producing a frequency compensation signal based on the first and second logic signals.

15. The method of claim 14 further including dividing the first and second divided local oscillation signals by "2" prior to the step of converting to the upper and lower threshold voltage signals, and wherein dividing by "2" produces a signal with a 50% duty cycle.

16. The method of claim 14 wherein the step of dividing the reference voltage signal by "2" produces a divide reference signal with a 50% duty cycle.

17. The method of claim 14 wherein the frequency compensation signal comprises a multi-state signal for selecting among a plurality of capacitor configurations.

18. A direct conversion Radio Frequency (RF) transceiver integrated circuit comprising:
 a baseband processor for producing an outgoing baseband signal and for processing an incoming baseband signal; and
 wherein the baseband processor produces a frequency initiation signal for selecting and initiating a local oscillation frequency;
 a local oscillator that generates an RF local oscillation signal corresponding to an RF channel, the local oscillator further including a capacitor bank comprising a plurality of switched capacitors, and wherein analog open-loop VCO calibration circuitry selects at least one switched capacitor of the plurality of switched capacitors, the at least one switched capacitor for adjusting the tuning ranged of the VCO;
 a period-to-voltage conversion module coupled to receive a divided local oscillation and a divided reference signal, the period-to-voltage module to convert the divided local oscillation and the divided reference signal to a threshold voltage signal and a reference voltage signal, respectively;
 a comparator module coupled to receive the threshold and reference voltage signals, the comparator module for comparing the threshold and reference voltage signals and for producing a frequency adjustment signal;
 a receiver section operably coupled to the local oscillator to receive the RF local oscillation signal, wherein the receiver section receives an incoming RE signal, and wherein the receiver section down-converts, based partially upon a frequency compensation signal derived from the frequency adjustment signal by logic, the incoming RE signal based upon the RE local oscillation signal to produce the incoming baseband signal; and
 a transmitter section operably coupled to the local oscillator to receive the RE local oscillation signal, wherein the transmitter section receives an outgoing baseband signal, and wherein the transmitter section up-converts the outgoing baseband signal to produce an outgoing RE signal.

19. The RE transceiver integrated circuit of claim 18, wherein the VCO further comprises:
 a voltage variable capacitor (varactor) coupled to receive a control voltage, the varactor for providing a fine VCO frequency control;
 an inductor, coupled in parallel to the varactor and the capacitor bank, wherein the parallel coupled inductance and capacitance form a tuned circuit for producing an oscillating current at an RE frequency; and
 transconductance circuitry for providing energy to maintain the RE local oscillating signal.

20. The RF transceiver integrated circuit of claim 19, wherein the local oscillator further comprises a phase locked loop (PLL) comprising:
 a reference signal;
 a frequency divider coupled to receive the RF local oscillating signal and to produce a divided RF local oscillating signal, wherein the frequency divider dividing ratio is set so as to produce a divide RF local oscillating signal approximately equal to the reference signal;
 phase frequency detector (PFD) for comparing the divided RF local oscillation signal to the reference signal, the PFD producing frequency correction signals for correcting the frequency of the VCO; and
 charge pump circuitry coupled to receive the frequency correction signals and for converting the frequency correction signals into a control voltage, wherein the control voltage causes the VCO frequency to adjust such that frequency correction signals are substantially zero.

21. The RF transceiver integrated circuit of claim 20, wherein the analog open-loop VCO calibration circuitry initiates a calibration cycle upon receipt of the calibration initiation signal received from the coupled baseband processor.

22. The RF transceiver integrated circuit of claim 21, wherein the analog open-loop calibration circuit further comprises:
 a frequency divider module coupled to receive a local oscillation signal and a reference signal, the frequency divider module producing the divided local oscillation and the divided reference signal;
 a logic module coupled to receive the frequency adjustment signal, the logic module for producing the frequency compensation signal.

23. The calibration circuit of claim 22 wherein the frequency compensation signal comprises a multi-bit signal that defines whether a voltage controlled oscillator signal frequency should be increased or decreased.

24. The calibration circuit of claim 22 wherein the frequency compensation signal comprises a binary signal having a plurality of values wherein each value of the plurality of values represents a configuration of switched capacitors in a capacitor bank of a voltage controlled oscillator.

25. The calibration circuit of claim 22 wherein the logic module comprises combinational logic for producing the frequency compensation signal having more than two logic states responsive to receiving the frequency adjustment signal having more than two logic states.

26. The calibration circuit of claim 22 wherein the frequency divider module comprises a plurality of frequency dividers wherein each of plurality of frequency dividers divides the received local oscillation signal by a different amount.

27. The calibration circuit of claim 22 wherein the period-to-voltage conversion module comprises a plurality of period-to-voltage conversion blocks, one coupled to receive the divided output from each of the frequency dividers.

28. The calibration circuit of claim 27 wherein the period-to-voltage conversion module comprises a charge pump coupled in series with a peak detector.

29. The calibration circuit of claim 28 wherein the charge pump comprises a current source coupled in series with a pair of selectable switches, also coupled in series with each other and with a resistive element.

30. The calibration circuit of claim 27 wherein the selectable switches are complementarily selectable.

31. The calibration circuit of claim 30 wherein a first of the selectable switches is coupled to receive the divided reference signal and wherein a second of the selectable switches is coupled to receive a complementary divided reference signal produced by an inverter that is further coupled to receive the divided reference signal.

32. The calibration circuit of claim 27 wherein the peak detector is coupled to receive an output voltage signal from the charge pump and a reset signal from the logic module, wherein the peak detector produces a peak output voltage signal that reflects a peak value of the output voltage signal received from the charge pump so long as the reset signal is not received.

33. The calibration circuit of claim 27 wherein the peak detector comprises an amplifier having a positive input port coupled to receive an output voltage signal from the charge pump, an output port coupled to a gate terminal of a MOSFET, a current source coupled between a drain terminal of the MOSFET and a supply voltage, a capacitor coupled between a source terminal of the MOSFET and circuit common, a negative input port coupled to the MOSFET source terminal, and a selectable reset switch coupled across the capacitor.

34. A method for open loop calibration of a voltage controlled oscillator (VCO), the method comprising:
  receiving, in a calibration circuit logic module, a calibration initiation signal containing at least one frequency divider number;
  dividing a local oscillation signal and a reference signal by the at least one frequency divider number to produce a divided local oscillation signal and a divided reference signal;
  converting, in a period-to-voltage converter, the divided local oscillation signal into a threshold voltage signal proportional to the period of the divided local oscillation signal;
  converting, in a period-to-voltage converter, the divided reference signal into a reference voltage signal proportional to the period of the divided reference signal;
  comparing the threshold voltage signal and the reference voltage signal to produce a frequency adjustment signal;
  generating a frequency compensation signal from the frequency adjustment signal, said frequency compensation signal comprising a binary signal having a plurality of values; and
  setting, with the frequency compensation signal, at least one switched capacitor from a plurality of switched capacitors in a capacitor bank, wherein setting the at least one switched capacitor changes the VCO tuning range.

35. The method of claim 34 wherein the step of dividing the local oscillation signal and the reference signal further includes the step of dividing each signal by two to produce a fifty percent duty cycle signal.

36. The method of claim 34 further includes the step of:
  opening a first loop switch in the VCO calibration loop thereby removing a control voltage from the VCO; and
  closing a second loop switch in the VCO calibration loop thereby connecting a voltage approximately equal to one-half the supply voltage to the VCO.

37. The method of claim 34 further includes setting a frequency compensation signal to a nominal value and producing a nominal local oscillation signal.

38. The method of claim 37 further including adjusting the frequency compensation signal to approximately match the divided local oscillation signal with the divided reference signal.

* * * * *